United States Patent [19]

Suzuki et al.

[11] 4,136,292

[45] Jan. 23, 1979

[54] VOLTAGE SENSING CIRCUIT OF DIFFERENTIAL INPUT TYPE

[75] Inventors: Yasoji Suzuki, Ayase; Kiyofumi Ochii, Kawasaki, both of Japan

[73] Assignee: Tokyo Shibaura Electric Co., Ltd., Tokyo, Japan

[21] Appl. No.: 827,721

[22] Filed: Aug. 25, 1977

[30] Foreign Application Priority Data

Sep. 30, 1976 [JP] Japan .................................. 51-117547

[51] Int. Cl.² .............................................. H03K 5/20
[52] U.S. Cl. .............................. 307/355; 307/DIG. 3; 330/253; 365/208
[58] Field of Search ................. 307/355, 362, DIG. 3; 330/253; 365/205, 207, 208

[56] References Cited

U.S. PATENT DOCUMENTS

| | | | |
|---|---|---|---|
| 3,854,101 | 12/1974 | Muramatsu | 330/253 |
| 3,967,252 | 6/1976 | Donnelly | 37/355 X |
| 4,003,034 | 1/1977 | Au | 307/DIG. 3 X |
| 4,050,030 | 9/1977 | Russell | 330/253 X |

*Primary Examiner*—Lawrence J. Dahl
*Attorney, Agent, or Firm*—Finnegan, Henderson, Farabow & Garrett

[57] ABSTRACT

A voltage sensing circuit of differential input type includes at least one differential amplifier circuit connected between two complementary data lines of a semiconductor memory. The differential amplifier circuit detects data in response to a minute potential difference between the data lines and amplifies the same by a substantial change in conductance $g_m$ of metal oxide semiconductor field effect transistors (MOSFET) used in the circuit. When data is read from a semiconductor memory onto the data lines, the differential amplifier sensing circuit detects the data quickly by detecting potential changes of the data lines.

9 Claims, 10 Drawing Figures

F I G. 3
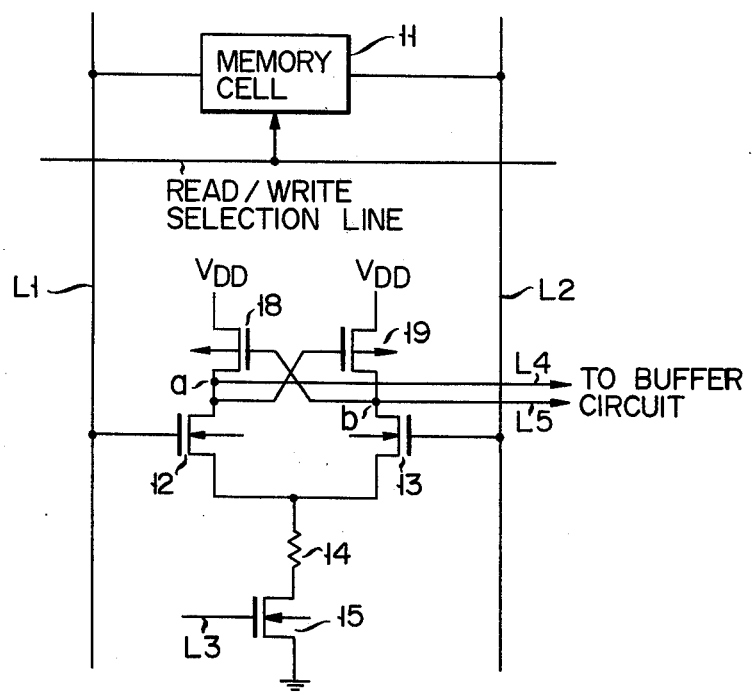
F I G. 4
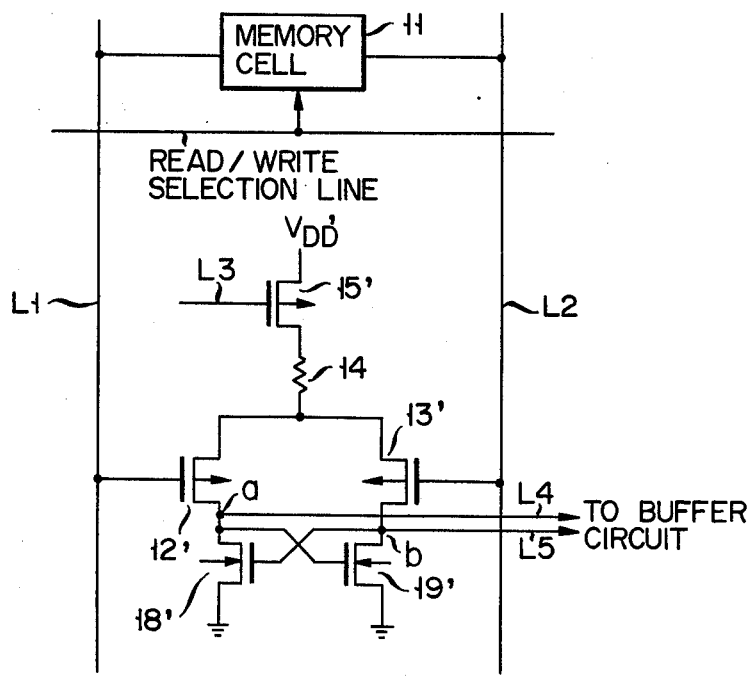

VOLTAGE SENSING CIRCUIT OF DIFFERENTIAL INPUT TYPE

This invention relates to a voltage sensing circuit for a semiconductor memory, and more particularly, to a voltage sensing circuit of differential input type for detecting a minute data signal read out to the data lines of the memory.

As well known, a semiconductor memory, particularly a memory of a large memory capacity for a computer, comprises insulated gate field effect transistors (IGFET) or metal oxide semiconductor field effect transistors (MOSFET). A memory comprised of IGFET's is easily adapted to large scale integration (LSI). But is operates more slowly than a memory comprised of bipolar transistors. Thus many attempts have been made and are being made to impart a high operation speed to a memory constituted by IGFET's.

The operation speed of an IGFET memory largely depends on the voltage sensing circuit coupled to data lines of the memory. The sensing circuit detects data read out to the data lines from a selectively accessed one of the memory cells, i.e., the fundamental unit of the IGFET memory, and then amplifies the data.

One of the known voltage sensing circuits is an inverter type such as the inverter circuit disclosed in K. SIGA, T. ITO and T. ABE "A MONOSTABLE C-MOS RAM WITHSELFREFRESH MODE", ISSCC digest of technical data, February 1976, pp. 134-135. Also known is a latch type voltage sensing circuit which has a latch circuit such as shown in K. GOSER and M. POMPER "FIVE-TRANSISTOR MEMORY CELL IN ESSIMOS", $I^3E$ journal of solid state circuit, vol. SC8, October 1973, pp. 324-326. However, these sensing circuits remain inoperative until the potential of the data lines or potential difference between the data lines exceeds the circuit threshold level. Therefore, a time loss inevitably occurs in sensing data read out of memory.

Further known is a semi-static voltage sensing circuit as described in K. OCHI, Y. SUZUKI, etc. "$C^2$-MOS 4K STATIC RAM", ISSCC-digest technical paper, February 1977, pp. 18-19. This sensing circuit comprises MOSFET's and remains inoperative until the potential of the data lines exceeds the threshold voltage of a MOSFET. Thus a time loss is also unavoidably observed in this voltage sensing circuit.

Any one of, or any combination of the above-mentioned voltage sensing circuits is usually employed in a complementary MOS (CMOS) memory. But due to the time loss in the sensing circuit, the data access time is adversely long. To shorten the data access time to, for example, 100ns more or less, a voltage sensing circuit of a new type is required.

Accordingly an object of this invention is to provide a voltage sensing circuit of differential input type for a semiconductor memory, which comprises MOSFET's and which detects and amplifies a minute difference between a reference potential and the potential of a data read out to one or two data lines of a memory in the form of a substantial change in conductance $g_m$ of said MOSFET's.

Another object of the invention is to provide a voltage sensing circuit of differential input type for a semiconductor memory, which shortens the access time of the memory.

According to a broad aspect of this invention, there is provided a voltage sensing circuit of differential input type for a semiconductor memory, which comprises at least one differential amplifier circuit constituted by a first metal oxide semiconductor (MOS) transistor the gate of which is connected to a data line; a second MOS transistor the gate of which is connected to the other data line in case data are read out from the memory through two data lines and a reference potential in case data are read out from the memory through only one data line; a constant current source connected between a first power source and the junction of the corresponding terminals of the first and second MOS transistors; a first resistor connected between a second power source and the other terminal of the first MOS transistor; and a second resistor connected between the second power source and the other terminal of the second MOS transistor.

According to an aspect of this invention, there is provided a voltage sensing circuit of differential input type for a semiconductor memory, comprising a plurality of multiple connected differential amplifier circuits.

This invention can be more fully understood from the following detailed description when taken in conjunction with the drawings, in which:

FIG. 3 is a circuit diagram of a voltage sensing circuit, according to still another embodiment of the invention wherein transistors acting as load resistors are used in place of the resistors of the embodiment of FIG. 1;

FIG. 4 is a circuit diagram of a voltage sensing circuit, according to a further embodiment of the invention wherein use is made of MOS transistors of the opposite channel type to that of the MOS transistors in the embodiment of FIG. 3;

Figure 1:
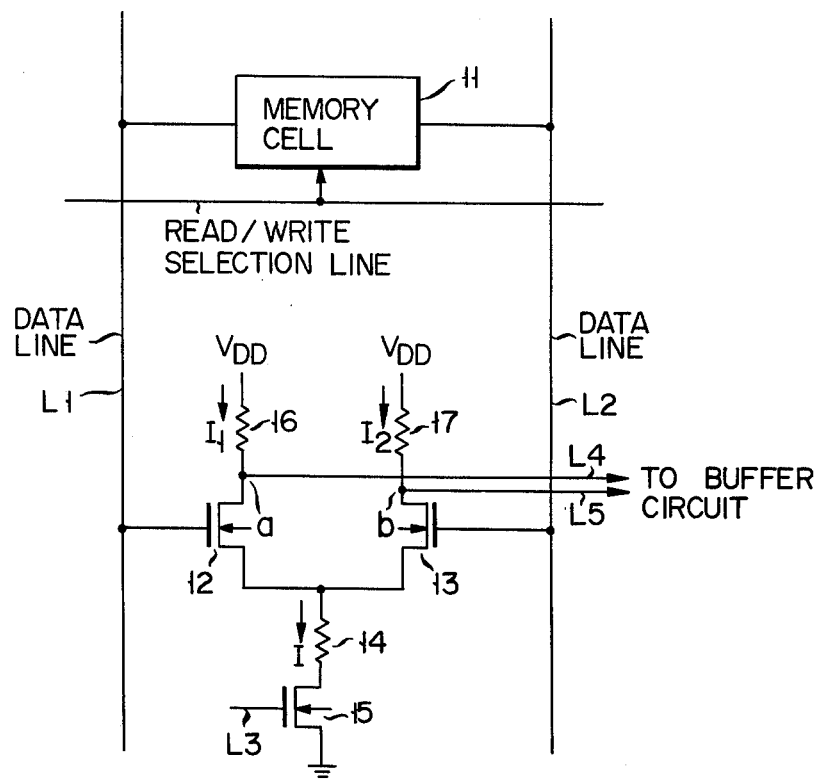
FIG. 1 is a circuit diagram of a voltage sensing circuit, according to one embodiment of this invention.

With reference to FIG. 1, a first embodiment of the invention will be described.

A random access memory (RAM) constituted by a plurality of memory cells 11 (one of which is shown in the figure) is connected to two data (bit) lines L1 and L2. The cell 11 is selectively accessed by a signal supplied through a read/write selection line. When accessed the memory cell 11 reads out data on the data lines L1 and L2. When data is written into, or read from, any memory cell 11, complementary data signals appear on the data lines L1 and L2.

N-channel MOS transistors 12 and 13 have their gates connected to the data lines L1 and L2, respectively. The sources of the transistors 12 and 13 are connected to each other. To the junction of the sources of the transistors 12 and 13 there is connected one terminal of a level adjusting resistor 14 having a specific resistance. The level adjusting resistor 14 may be dispensed with, if unnecessary. The other terminal of the resistor 14 is grounded through an N-channel constant current transistor 15 which operates in the saturation region. To the gate of the transistor 15 a chip selection line L3 is connected, whereby the transistor 15 is turned off if memory cells associated with the chips containing memory are not selected.

The drains of the N-channel MOS transistors 12 and 13 are connected to a source voltage $V_{DD}$ (in this case, positive voltage) through resistors 16 and 17, respectively. The resistors 16 and 17 cooperate to determine the output voltage level of the voltage sensing circuit. A sensor output line L4 is connected to the output terminal or drain electrode a of the transistor 12, and another sensor output line L5 to the output terminal or drain electrode b of the transistor 13. The output level of the sensor output line L4 is complementary to that of the sensor output line L5. Through these sensor output lines L4 and L5 a differential sensor output is obtained. Based on such a differential sensor output, read out data is detected. The detected data is supplied to a buffer circuit (not shown).

Suppose the N-channel MOS transistors 12 and 13 have the identical characteristics. Since the transistors 12 and 13 have the same conductance $g_m$, when the transistors 12 and 13 are both conductive the following equations are established provided that the resistors 16 and 17 have the same specific resistance $R_1$:

$$I_1 = I_2, I = I_1 + I_2,$$

where $I_1$ denotes the current flowing through the resistor 16, $I_2$ the current flowing through the resistor 17, and I the current flowing through the level adjusting resistor 14.

It will now be explained how the voltage sensing circuit shown in FIG. 1 operates. When any memory cell of the RAM is addressed by a signal coming through the read/write selection line and, at the same time, a "chip enable" signal is supplied to the gate of the constant current transistor 15 through the chip selection line L3, transistor 15 is rendered conductive. For the following explanation assume that from the addressed memory cell 11 data "1" and "0" are read out to the data lines L1 and L2.

In this case, the potential on the data line L2 supplied with the data "0" becomes lower, and the potential on the other data line L1 supplied with the data "1" becomes higher. The potentials on the data lines L1 and L2 gradually change since the data lines L1 and L2 each has a relatively large CR time constant ("C" and "R" stand for stray capacity and wiring resistance, respectively).

The conventional voltage sensing circuits fail to function until the change in potential on the data lines of a memory surpasses the threshold voltage or the threshold voltage of the circuits constituent elements. Consequently, conventional voltage sensing circuits encounter a time loss during operation. In contrast, in the voltage sensing circuit of differential input type according to this invention, the transistors 12 and 13 respond to minute potential changes on the data lines L1 and L2 and amplify the minute potential changes in the following way.

Currents $I_1$ and $I_2$ flowing through transistors 12 and 13 change in response to minute potential changes on the data lines L1 and L2 respectively. The changes in currents $I_1$ and $I_2$ immediately after the potential of data line L1 has become higher than that of data line L2 may be indicated by "$+\Delta I$" and "$-\Delta I$", respectively.

Then, the potential difference between the output terminal a of the transistor 12 and the output terminal b of the transistor 13 is represented as: $2R_1 \cdot \Delta I$. This potential different $2R_1 \cdot \Delta I$ is quite large as compared with the actual potential difference between data lines L1 and L2. Thus, the voltage sensing circuit including the transistors 12 and 13 supplies an output signal $2R_1 \cdot \Delta I$ to the buffer circuit (not shown) through the sensor output lines L4 and L5 which can be used as read out data.

In other words, even when a minute potential difference occurs between the data lines L1 and L2, which is so small that it cannot be detected as data by conventional circuits, the transistors 12 and 13 have their respective conductances $g_m$ changed, in response to the minute potential differences at their gate and source electrodes, thereby amplifying these minute potential differences to such an extent as can be detected as data by a standard buffer circuit. For this reason, when the potential of a data line supplied with, for example, a data "0" has its potential lowered very little below the potential of a complementary data line supplied with a data "1", the voltage sensing circuit begins to operate at once, without such a time loss as would inevitably occur in the conventional voltage sensing circuit. The voltage sensing circuit of the present invention thereby serves to shorten data access time effectively.

As mentioned above, the MOS transistors 12 and 13 can have their respective conductances $g_m$ changed in response to a minute potential difference. The more similar the characteristics of MOS transistors 12 and 13, and the greater their conductance $g_m$, the higher the sensitivity and the larger the amplification of the sensing circuit.

Figure 2:
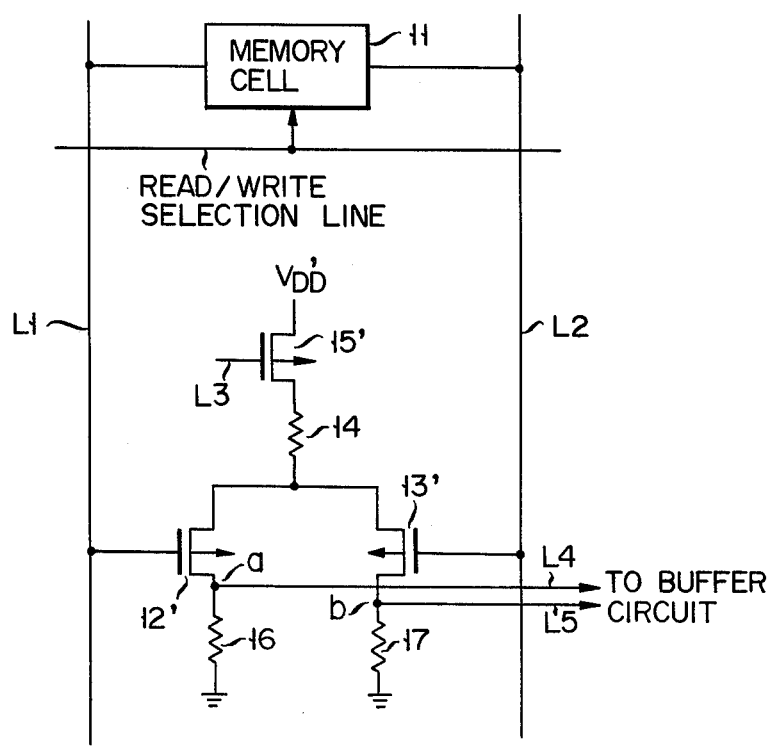
FIG. 2 is a circuit diagram of a voltage sensing circuit, another embodiment of the invention wherein use is made of MOS transistors of the opposite channel type to that of the MOS transistors in the embodiment of FIG. 1.
Figure 5:
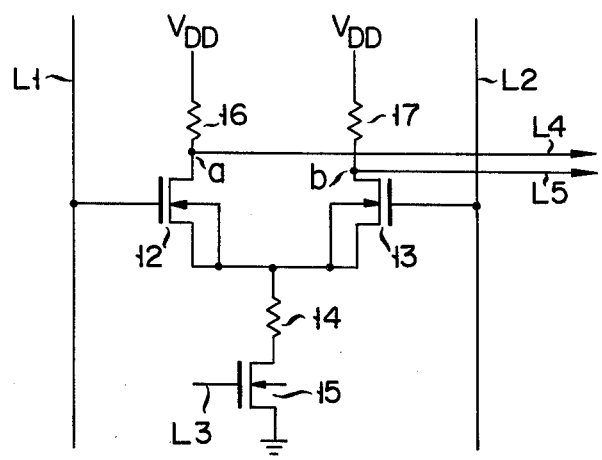
FIGS. 5 to 8 show modifications of the embodiments of FIGS. 1 to 4, respectively, wherein the transistors constituting a differential amplifier circuit have each a back gate (an arrow shown in figure) connected to the source terminal.
Figure 6:
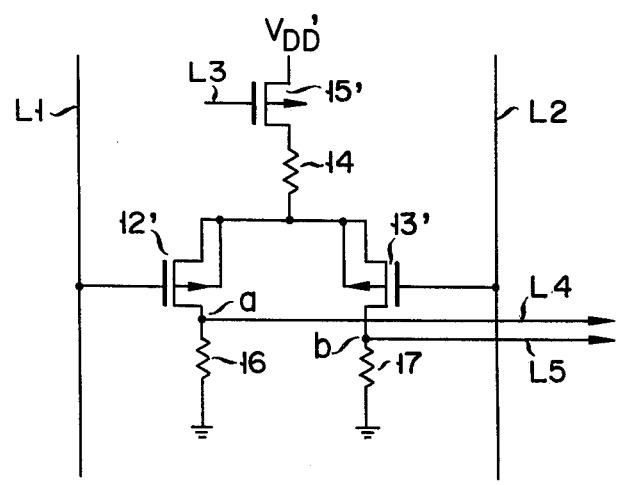
Figure 7:
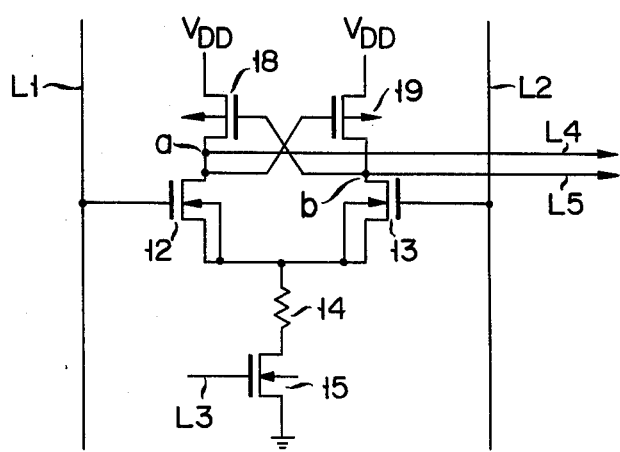
Figure 8:
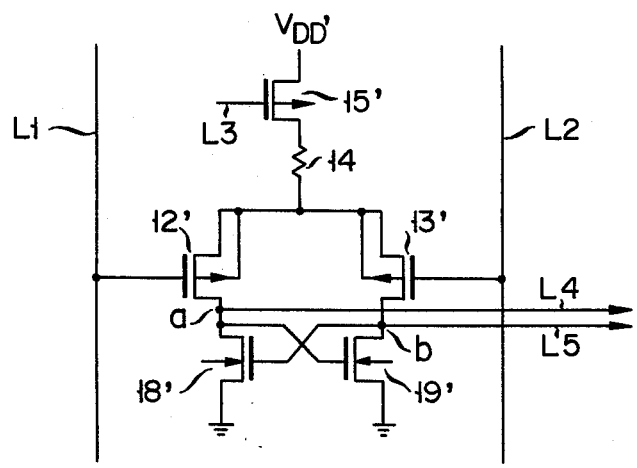

In a second embodiment shown in FIG. 2, P-channel MOS transistors 12', 13' and 15' are used in place of the N-channel transistors 12, 13 and 15 in the voltage sensing circuit of FIG. 1. The other constituent elements of this sensing circuit are identical with the corresponding elements of the first embodiment of FIG. 1 and are thus denoted by the same reference numerals. Since the channel type of the transistors 12', 13' and 15' is opposite to that of the transistors 12, 13 and 15 of the first embodiment, the resistors 16 and 17 are grounded and the constant current transistor 15' is connected to the DC power supply voltage $V_{DD}$.

In a third embodiment of this invention as illustrated in FIG. 3, non-linear load MOS transistors 18 and 19 of P-channel are provided instead of the resistors 16 and 17 in the first embodiment of FIG. 1. These load MOS transistors 18 and 19 have their gates connected to the output terminals b and a, respectively. They are transistors to determine the output levels of the voltage sensing circuit. Suppose a memory cell 11 of the RAM is designated and that data "0" and "1" are read out from the memory cell 11 to the data line L1 and L2, respectively. When the potential on the data line L1 is lowered a little, and the potential on the data line L2 elevated a little, the minute potential changes on the data lines L1 and L2, i.e., differential gate inputs, vary the conductance $g_m$ of the transistors 12 and 13, respectively. More specifically, the conductance $g_m$ of the transistor 12 is reduced, while the conductance $g_m$ of the transistor 13 is increased. Thus, the potential level of the sensor output line L4 connected to the transistor 12 is elevated, and the sensor output line L5 connected to the transistor 13 is lowered. Further, since the load transistors 18 and 19 have their gates and source electrodes cross-coupled, they act as feed back resistors. Accordingly the conductance $g_m$ of the load transistor 18 is increased, while the conductance $g_m$ of the load transistor 19 is reduced. Namely, the resistance of the transistor 18 is reduced, and that of the transistor 19 increased. In this way, the amplification factor of the voltage sensing circuit can be made larger effectively. In addition, the sensing circuit of FIG. 3 consumes less power than the sensing circuit of FIG. 1 since use is made of cross-coupled load transistors for resistors.

A fourth embodiment shown in FIG. 4 is identical with the voltage sensing circuit of FIG. 3 except that MOS transistors of the opposite channel type are used. That is, P-channel MOS transistors 12', 13' and 15' replace the N-channel transistors 12, 13 and 15 of the sensing circuit of FIG. 3, and N-channel load transistors 18' and 19' replace the P-channel load transistors 18 and 19 of the sensing circuit of FIG. 3. Since the channel type of the transistors is changed, the load transistors 18' and 19' are grounded, and the source of the constant current transistor 15' is connected to the source voltage $V_{DD}$. This circuit operates in the same way as that of FIG. 3.

In the voltage sensing circuits shown in FIGS. 1 to 4, the differential amplifier circuit has an amplification factor which becomes large as the conductance $g_m$ of the transistors 12 and 13 (or 12' and 13') become large. However, since the back gate of each switching transistor 12 and is grounded or connected to the source voltage $V_{DD}$, the substrate potential (i.e., back gate potential) of the transistor is biased to become higher than the source potential. As a result, the apparent conductance of the transistor is reduced. This undesirable phenomenon is generally called "back gate bias effect". If the voltage sensing circuit is so designed as to reduce or eliminate such a back gate bias effect, it will allow detection of data from memory at a higher speed.

FIGS. 5 to 8 show embodiments of this invention which eliminate the above-mentioned back gate bias effect. These voltage sensing circuits are identical with the circuits of FIGS. 1 to 4, respectively, except that the transistors 12 and 13 (or 12' and 13') have each a back gate connected to the source terminal. Owing to the back gate connection, the substrate and source potentials of each transistor of the differential amplifier circuit are made equal. Thus, although the pattern area of the voltage sensing circuit is somewhat increased due to the provision of back gate to source connections, the sensitivity of the voltage sensing circuit becomes better. Consequently, the circuit detects data from a memory more quickly, thereby shortening data access time.

The voltage sensing circuits shown in FIGS. 5 to 8 operate in the same manner as the circuits of FIGS. 1 to 4, respectively.

Figure 9:
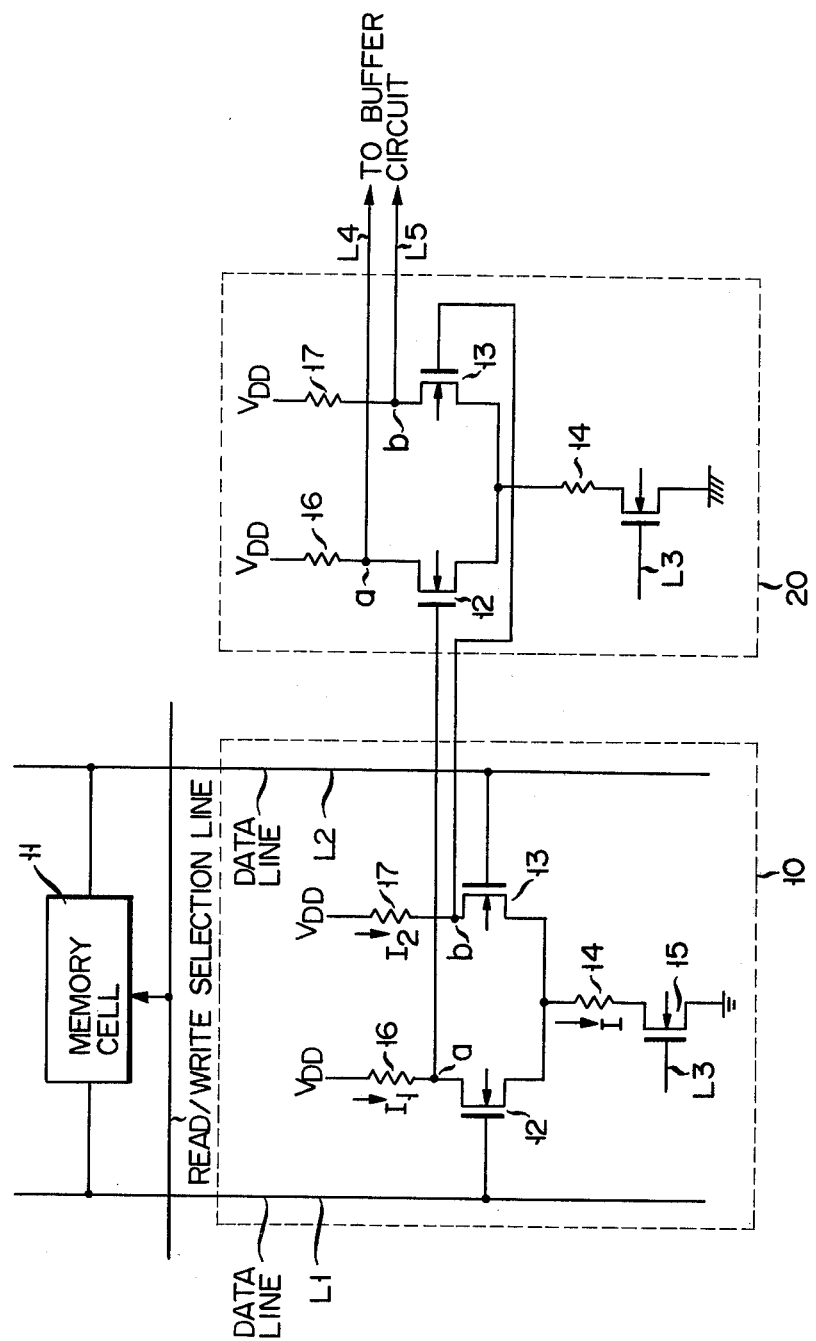
FIG. 9 shows a voltage sensing circuit using the embodiment of FIG. 1, wherein a plurality of differential amplifier circuits are provided.

The voltage sensing circuit according to this invention may includes two or more differential amplifier circuits. For example, it may have two differential amplifier circuits as illustrated in FIG. 9. In the voltage sensing circuit of FIG. 9, the first differential amplifier circuit 10 amplifies data read to the data lines L1 and L2 of memory cell 11. The output signal of the first differential amplifier circuit 10 is further amplified by the second differential amplifier circuit 20, which has the same construction as the first one 10. Even if the output of the first differential amplifier circuit 10 is small, the second differential amplifier circuit 20 can produce an output large enough to be fed into a buffer circuit (not shown). This means that the voltage sensing circuit shown in FIG. 9 shortens the data access time more than the circuits of FIGS. 1 to 8 which have one differential amplifier circuit.

Figure 10:
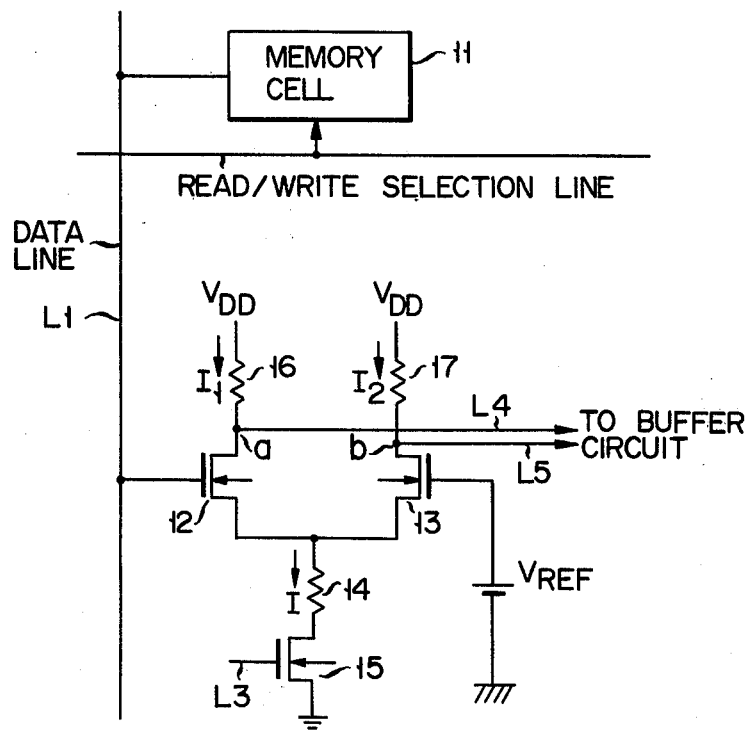
FIG. 10 shows the embodiment of FIG. 2 connected to a memory having only one data line.

The voltage sensing circuits of FIGS. 1 to 9 are coupled to a static RAM. But they may be used in combination with a dynamic RAM which has only one data line L1, as shown in FIG. 10. In this case, the gate of the MOS transistor 12 is connected to the data line L1, and the gate of the MOS transistor 13 to a reference voltage source $V_{REF}$. Thus a data read out from a memory cell 11 of the dynamic RAM is supplied to the gate of the transistor 12, while the reference voltage is applied to the gate of the transistor 13. Namely, the voltage sensing circuit amplifies a potential change in the data line L1 with respect to the reference source which has been incorporated in the integrated circuit containing the dynamic RAM and the voltage sensing circuit. The voltage sensing circuit shown in FIG. 10 can therefore detect a minute difference between the reference potential and the potential on the sole data line of a dynamic RAM, thereby effecting data detection at a high speed.

What we claim is:

1. A voltage sensing circuit for sensing data read out of a memory cell through first and second complementary data lines coupled to said memory cell, comprising:

first and second MOS transistors of one channel type each having drain, source and gate electrodes, said gate electrodes of said first and second transistor being connected to said first and second data lines, respectively;

first and second load resistive impedance means for coupling said drain electrodes of said first and second transistors, respectively, to one terminal of a DC power supply source; and a third constant current source MOS transistor of said one channel type for coupling said source electrodes of said first and second transistors to the other terminal of said DC power supply source, said third transistor being rendered ON in response to application of a control signal to a gate electrode thereof to cause said voltage sensing circuit to sense data on said first and second data lines.

2. A voltage sensing circuit according to claim 1 wherein each of said first and second load resistive impedance means is a resistance element.

3. A voltage sensing circuit according to claim 1 wherein said first and second load resistive impedance means are fourth and fifth MOS transistors of the other channel type, having gate electrodes cross-coupled to said drain electrodes of said second and first transistors.

4. A voltage sensing circuit according to claim 1 wherein said first and second transistors have back gate electrodes connected to said source electrodes of said first and second transistors.

5. A voltage sensing circuit according to claim 1 further comprising a resistive element connected between said source electrodes of said first and second transistors and said third transistor.

6. A voltage sensing circuit for sensing data read out of a memory cell through a single data line coupled to said memory cell comprising:

first and second MOS transistors of one channel type each having drain, source and gate electrodes, said gate electrode of said first transistor being coupled to said single data line and said gate electrode of said second transistor being coupled to a reference voltage source;

first and second load resistive impedance means for coupling said drain electrodes of said first and second transistors, respectively, to one terminal of a DC power supply source; and a third constant current source MOS transistor of said one channel type for coupling said source electrodes of said first and second transistors to the other terminal of said DC power supply source, said third transistor being rendered ON in response to application of a control signal to a gate electrode thereof to cause said voltage sensing circuit to sense data on said single data line.

7. A voltage sensing circuit according to claim 6 wherein each of said first and second load resistive impedance means is a resistance element.

8. A voltage sensing circuit according to claim 6 wherein said first and second load resistive impedance means are fourth and fifth MOS transistors of another channel type, having gate electrodes cross-coupled to said drain electrodes of said second and first transistors.

9. A voltage sensing circuit according to claim 6 wherein said first and second transistors have back gate electrodes connected to said source electrodes of said first and second transistors.

* * * * *